United States Patent [19]

Johnson et al.

[11] 4,044,330
[45] Aug. 23, 1977

[54] POWER STROBING TO ACHIEVE A TRI STATE

[75] Inventors: Robert B. Johnson, Billerica; Chester M. Nibby, Jr., Peabody, both of Mass.

[73] Assignee: Honeywell Information Systems, Inc., Waltham, Mass.

[21] Appl. No.: 671,802

[22] Filed: Mar. 30, 1976

[51] Int. Cl.[2] .................. G11C 13/00; G11C 11/40
[52] U.S. Cl. .................. 340/166 R; 340/173 R; 307/209; 307/238; 307/246
[58] Field of Search .... 340/166 R, 174 WA, 174 AB, 340/174 AD, 173 R

[56] References Cited

U.S. PATENT DOCUMENTS

| | | | |
|---|---|---|---|
| 3,501,754 | 3/1970 | Davie | 340/174 WA |
| 3,564,517 | 2/1971 | McLean et al. | 340/174 AB |
| 3,665,473 | 5/1972 | Heimbigner | 340/166 FE |
| 3,806,880 | 4/1974 | Spence | 340/166 FE |
| 3,940,571 | 2/1976 | Ashley | 340/166 R |
| 3,942,160 | 3/1976 | Yu | 340/173 R |

*Primary Examiner* — Donald J. Yusko
*Attorney, Agent, or Firm* — Nicholas Prasinos; Ronald T. Reiling

[57] ABSTRACT

Apparatus and a method for coupling and uncoupling data-read lines of a memory array to a data bus. The data read-out lines of a memory array which is comprised of any combination of latched or non-latched tri-state memories are coupled to the data bus utilizing a conventional TTL circuit in combination with a power driver to simulate a tri-state buffer circuit. When the power driver removes power from the TTL circuit, a tri-state circuit is simulated; whereas when the power driver applies power to the TTL circuit, it operates in its normal mode and a normal impedance is presented between the data bus and the data-out lines of the memory array.

9 Claims, 11 Drawing Figures

POWER STROBING TO ACHIEVE A TRI STATE

RELATED REFERENCES

Incorporated into this application by reference are the following documents:

1. U.S. Patent Application Ser. No. 605,358, filed Aug., 8, 1975 for a "Transparent Tri-State Latch" invented by Edwin P. Fisher and assigned to the same assignee as the instant application.

2. Application Note A.P. -10 entitled "Memory System Design with the Intel 2107B 4k RAM", published in 1975 by Intel Corporation of 3065 Bowers Ave, Santa Clara, Calif. 95051.

BACKGROUND OF THE INVENTION

1. Field of the Invention

The field of the invention pertains to random access computer memories RAM's of the magnetic core or MOS type and particularly to a circuit and method for connecting data lines to a data bus.

2. Description of the Prior Art

Random access memories either of the magnetic core or of the MOS type generally require additional operations to be performed on the memory after read-out or write operations. For example, in the magnetic core memory read-out is effected by destroying the data content of the memory. To preserve the data content of the memory, a further write operation is required after read-out. Accordingly, in one type of prior art memory array data read out is latched to a data bus which preserves and presents this data to a data-latch during one memory cycle. In this type of a memory array known as a latched memory array data read out of the memory will remain on the data bus for one entire memory cycle even though the memory enable signal is removed, unless the data bus is disabled in some other manner. Once the data bus has presented the data to the data latch during one cycle, it may be desirable to utilize the remainder of that cycle by initiating a read operation in a second memory array and present the data-out to the data bus. However, since the data bus with this type of latched memory array remains latched to the previous data, it cannot be utilized during that memory cycle unless the data bus is disabled i.e. disconnected from the first memory array by presenting a high impedance to it. In prior art devices a tri-state buffer circuit is utilized to disconnect the latched memory arrays to the data bus. A typical tri-state buffer circuit being utilized is the SN75367 commercially available from Texas Instruments Inc. In normal operation the tri-state buffer circuit presents a high impedance to the memory array when its control is true i.e. its internally generated clock signal. When the control of the tri-state buffer circuit is not true, it presents a high or low state. (A tri-state circuit has three output characteristics ... high state, low state and high impedance state).

However, there are some serious disadvantages in utilizing this prior art tri-state buffer circuit. The main disadvantage is that it dissipates a considerable amount of power in operation since control of the different states of the circuit is not accomplished by manipulating the power input; hence power is constantly applied to the tri-state buffer circuit. In this day of energy conservation, this is intolerable and requires corrections.

What is required therefore is a new circuit or a new concept of operation which dissipates a small amount of power and is low in operating cost and yet simulates the states of prior art tri-state buffer circuits.

OBJECTS OF THE INVENTION

It is a primary object of the invention to provide an improved method and apparatus for coupling and uncoupling the data-out lines of memory arrays to a data bus.

It is another object of the invention to provide a low power buffer circuit which simulates the characteristics of a conventional tri-state buffer circuit.

Still another object of the invention is to provide a method of utilizing a commercially available circuit to simulate a tri-state circuit when the commercially available circuit is placed in one mode and to operate in its normal state when placed in another mode.

These and other objects of the invention will become apparent to a person of ordinary skill in the art.

SUMMARY OF THE INVENTION

A memory array is comprised of any combination of latched or non-latched tri-state memories. The latched memories are coupled to a data bus utilizing conventional commercially available TTL circuits (e.g. SN74H04 or SN74LS04) in combination with a power driver to simulate conventional tri-state buffer circuits. When the power driver/drivers remove(s) power from the TTL circuits, the tri-state characteristics are simulated; whereas when the power driver applies power to the TTL circuits, they operate in their normal mode and present a normal impedance between the data bus and data-out lines of the memory array.

BRIEF DESCRIPTION OF THE DRAWINGS

For a better understanding of the invention, reference may be had to the preferred embodiments, exemplary of the invention, shown in the accompanying drawings in which.

GENERAL DISCUSSION

Two types of RAM memory arrays of the MOS type are now commercially available from several semi-conductor manufacturers, such as Texas Instruments Inc., of Dallas, Tex., Intel Corporation, of Santa Clara, Calif. and others. One type of memory array is the latched tri-state type which latches data to a data bus via the data read-out, sometimes referred to as data-out lines, for one complete cycle, unless a buffer circuit is incorporated to disable the latched data or an additional cycle is provided to disable the latched data. Typical of this type of memory is the 2104 type commercially available from Intel Corporation, or the 4096 type available from Fairchild Semi-Conductor Corporation. A typical buffer tri-state circuit to disable the latch feature is the commercially available SN75367 or SN75368 circuits.

Another type of memory array is the non-latched tri-state type memory array. Typical of this type of MOS RAM is the 2107B available commercially from Intel Corporation of Santa Clara, Calif. and also the TI4030, 4050 and 4060 available from Texas Instruments Inc., of Dallas, Tex. In the latched type memory array the data on the read-out line is retained until the memory is subsequently recycled via an externally generated signal. In the non-latched memory array the output follows the input and is not latched to the read-out line; accordingly when the input enable signal is removed, so is the output.

Figure 1:
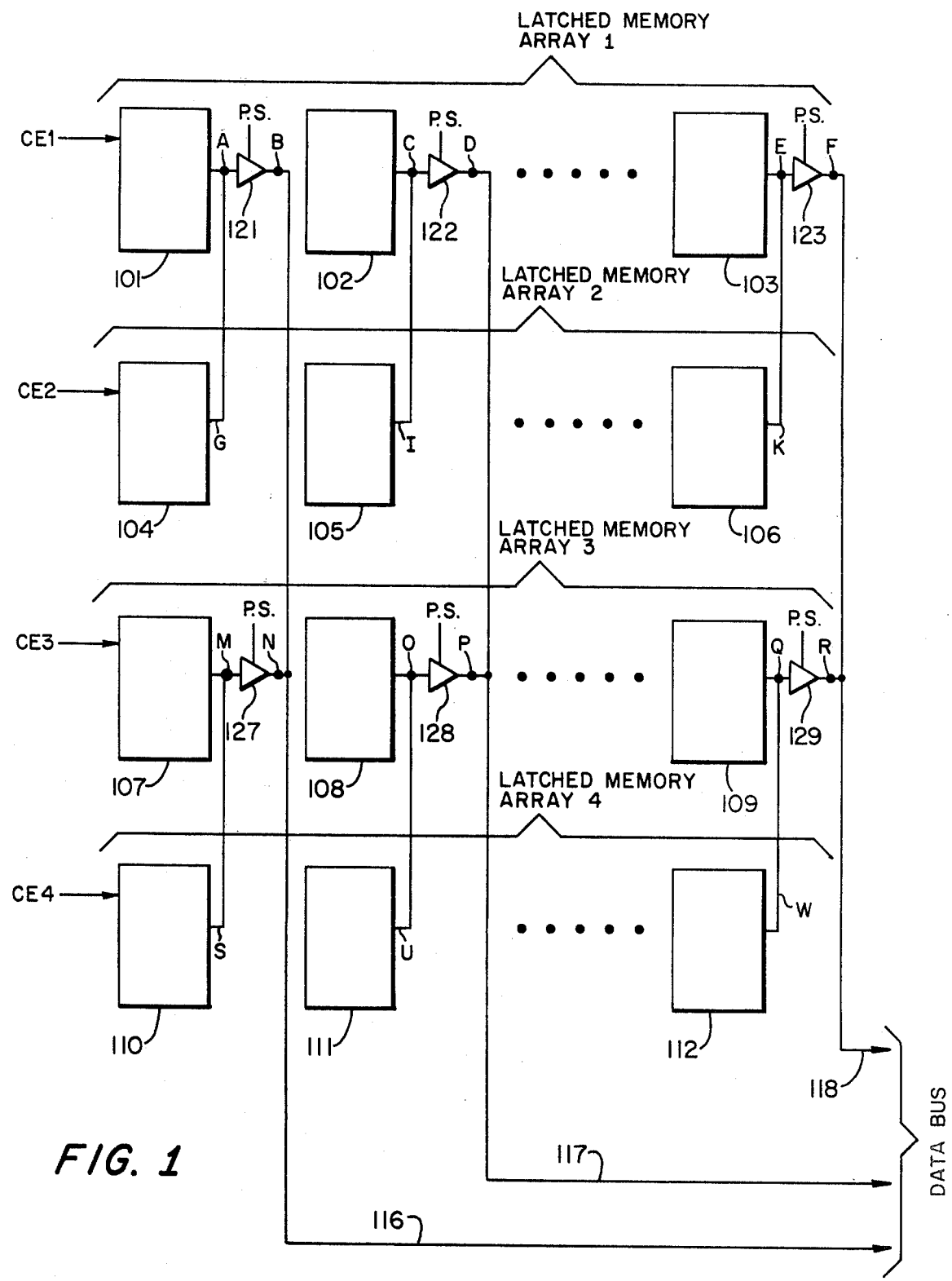
FIG. 1 is a 16K by six bit word memory array utilizing the invention.

Referring to FIG. 1 there is shown a 16 kilobit by six bit latched memory array utilizing the invention. Each memory chip 101-112 is of the latched type ... Intel 2104 or Fairchild 4096 type. For a six bit word, six columns of four rows each is utilized. Similarly, a word may comprise any number of bits by simply adding columns and the total capacity of the memory may be increased by simply adding rows. If an eight bit word was desired, then eight columns would be needed whereas an $n$ bit word would require $n$ columns. In FIG. 1 only one input terminal per memory chip has been shown ... the input terminal for the chip enable signal CE; however, it should be understood that other input and output terminals for control signals, address signals, data signals not essential to the invention, are a part of the device.

Figure 2:
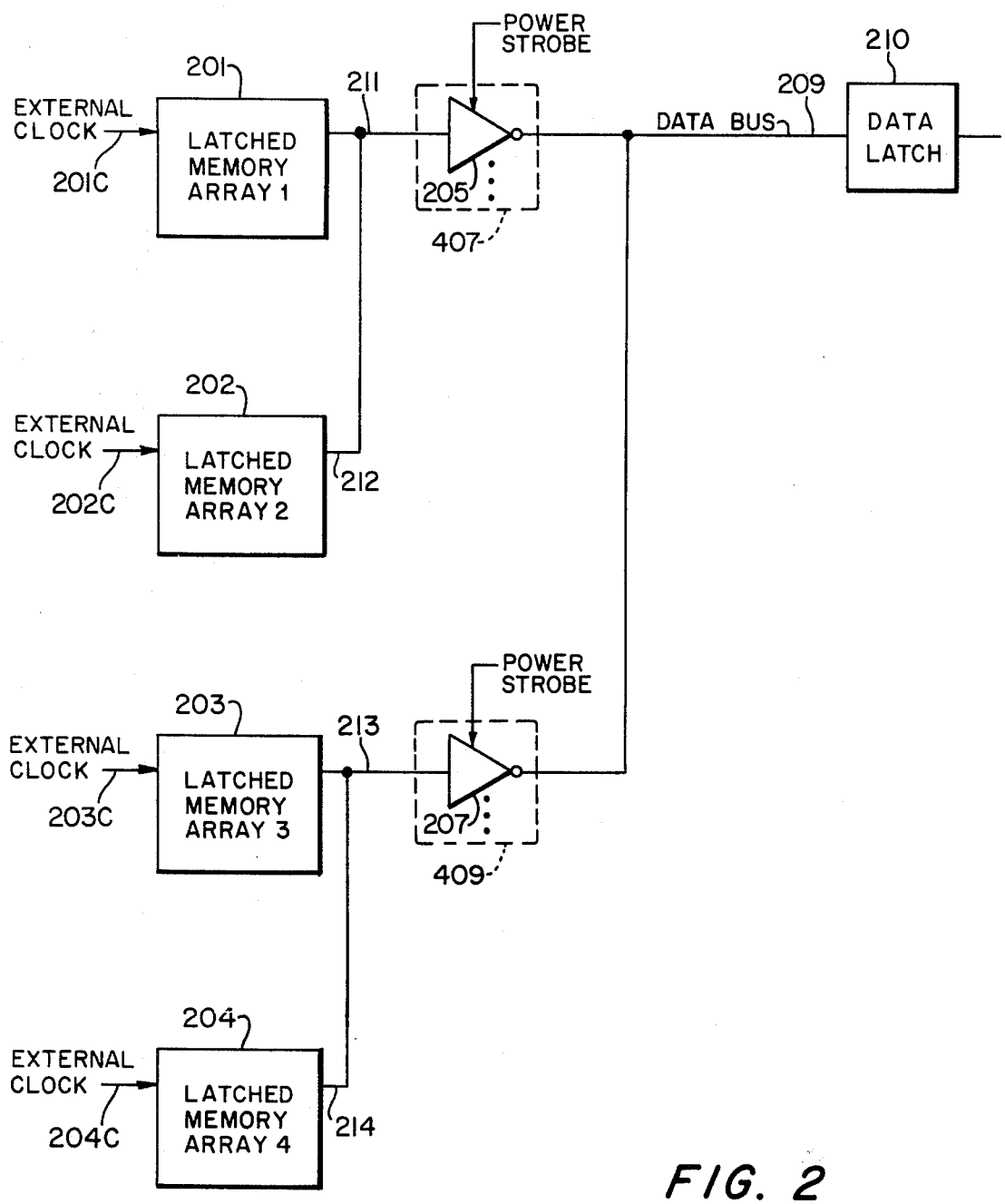
FIG. 2 is a schematic block diagram of one embodiment of the invention.
Figure 3:
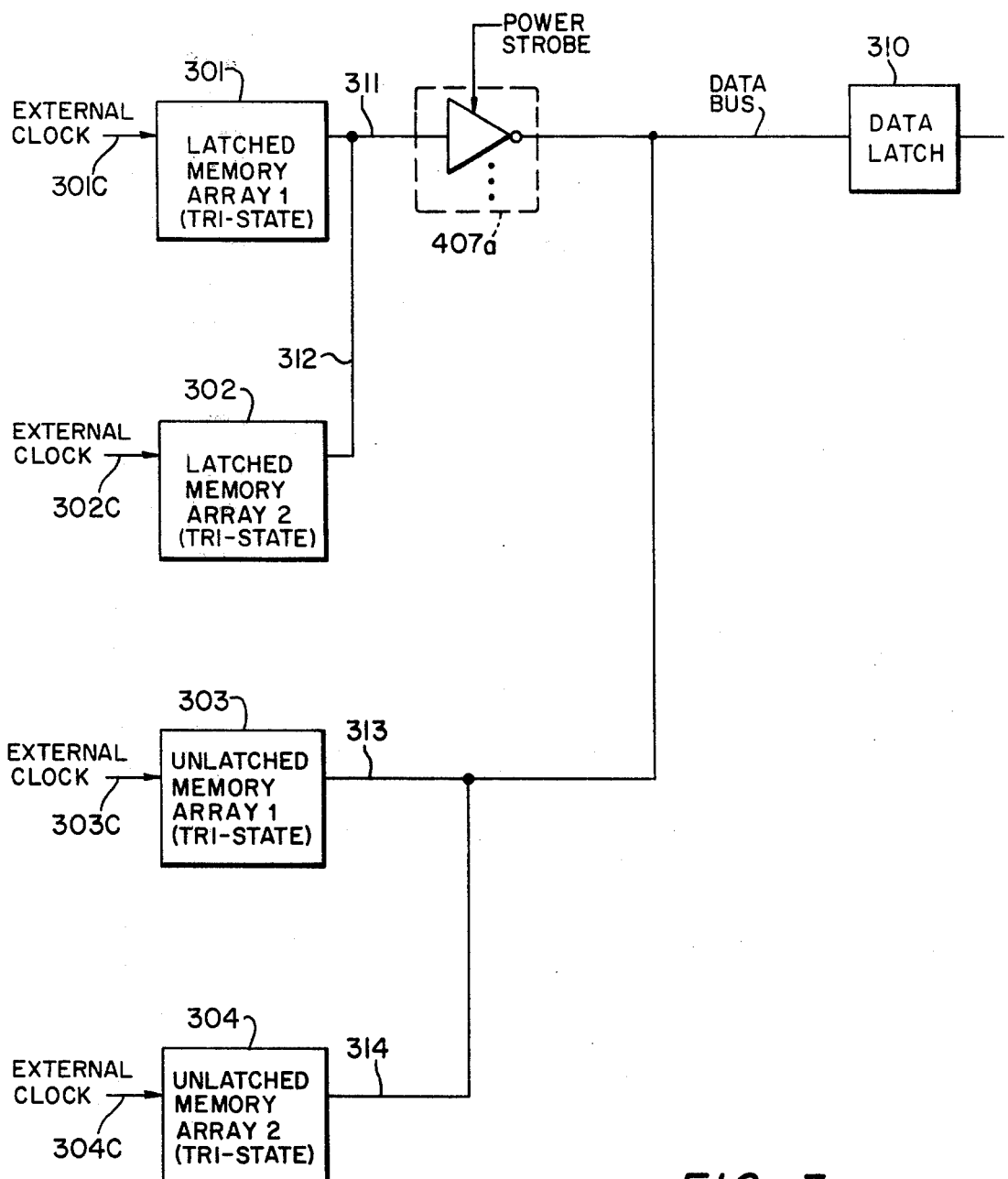
FIG. 3 is a schematic block diagram of another embodiment of the invention.

Referring now to FIGS. 1 through 4, memory array 1 of FIG. 1 comprised of MOS chips 101, 102 ... 103 is equivalent to latched memory array 201 of FIG. 2 and 301 of FIG. 3; also memory array 202 of FIG. 2 is similar to memory arrays 104-106. There is similar correspondence for memory arrays 3-4 of FIG. 1. However, in FIG. 3 a mixture of latched and unlatched memory arrays are shown; nonetheless, with this distinction, the correspondence still applies. Buffer circuits 121, 122 ... 123 of memory array 1 of FIG. 1 correspond to buffer circuits 205, etc., as shown on FIG. 2 and enclosed by dashed line rectangle 407. Similarly, these buffer circuits are shown closed by dashed line rectangle 407a in FIG. 3 and by full line rectangle 407b in FIG. 4. Each latched memory array 2 through 4 of FIG. 1 has its equivalent buffer circuits on FIGS. 2 and 4. However, since half the memory arrays of FIG. 3 are latched and half are unlatched, only the latched memory arrays require buffer circuits. It should be further noted that data-out lines A, C ... E of memory array 1 of FIG. 1 correspond to data-out lines $A_4, C_4 ... E_4$ of buffer circuit denoted by numeral 407b; moreover, output lines B, D ... F of memory array 1 of FIG. 1 correspond to output lines $B_4, D_4 ... F_4$ of buffer circuit 407b of FIG. 4. (Note on FIG. 4 that the memory arrays themselves are not shown but only the data-out line, the buffer circuit and the output lines). This analogy applies to memory array 3 of FIG. 1 with respect to buffer circuit 409b of FIG. 4. p Referring once again to FIG. 1, in order to select and latch a typical six bit word for example, in the semi-conductor chip memories 104, 105 ... 106 of the second row, the row-decode buffer in each chip (reference numeral 501 on FIG. 5a) addresses a selected row on FIG. 1 whereas other addresses pick proper cells within the memory chips 104, 105 ... 106. The addresses on the column decode (not shown) would then cross each appropriate cell (one cell per chip) within chips 104, 105 ... 106. Hence a six bit word within memory array 2 is selected with one bit of each word placed on data-out lines G, I ... K respectively. This information is latched to data output lines 116, 117 ... 118 until the next memory cycle or until disabled by any of the buffer circuits in 121-123, 127-129. If, on the other hand, unlatched tri-state memories are utilized for memory chips 101-112, no buffer circuits 121-132 would be necessary since the output of each chip would follow the chip enable, i.e. the internally generated clock signal responsive to the CE signals. The array of FIG. 1 can be combined with other similar arrays of the latched type or other arrays of the non-latched type to form a memory of large capacity. This is one of the advantages of the present invention in that hybrid memories can be utilized in the field and a user need not rely on any one manufacturer or any one type of memory.

When latched type memory arrays are combined and the data-out lines coupled to a data bus, a problem arises when it is required to utilize first one address then another address to read out data. It can readily be seen that the data from the first address must be disconnected from the data bus by presenting a high impedance before data from the second address can be latched onto the data bus. Moreover when mixed type memory arrays, some being of the latched type and others being of the non-latched type, are to be coupled to a data bus, there is a similar problem presented when it is first required to utilize a latched memory array and then a non-latched type of memory array. The latched memory array must be unlatched before the non-latched array can present its data to the data bus. However, as will be further described infra the latched type memory requires an internally generated disable signal. This disable signal is generated internally in response to every generated CAS (column address strobe) which in turn is generated in response to a RAS (row address signal). The first RAS and CAS signals generate the enable signals for a memory cycle, and in the case of a read-out data is latched. However, the second RAS and CAS signals may never materialize since they may be applied to enable a different memory which has been selected and hence are never directed to the first memory which is already enabled. Hence, no conventional interface exists to disable the first memory before enabling the second memory. The buffer circuit with the power strobe is the answer in this invention. Conventional prior art devices as previously discussed perform this function at the expense of relatively large power dissipation and/or cost.

DESCRIPTION OF THE PREFERRED EMBODIMENTS

Referring to FIG. 2 there is shown 4 latched memory arrays 201-204 corresponding to latched memory arrays 1-4 (i.e. 101-112) of FIG. 1. Any number of latched memory arrays may be utilized however, 4 are shown here as a convenient example. The data-out lines 211-214 of latched memory arrays 201-204 respectively are coupled to the data bus utilizing commercially available buffer circuits 205-207 of the SN74H04 type or the SN74LS04 type. (Note since a six bit word is being utilized there are six data-out lines per array, each data-out line being coupled to the data bus via a buffer circuit. Hence there are six buffer circuits per array. To avoid confusion, these buffer circuits are enclosed in dashed rectangles and numbered 407, 409 in FIGS. 2 through 4). Memory arrays 201-204 are enabled via clock signals 201c-204c respectively. When any one of these clock signals is provided to a selected memory they cause the generation of first RAS and CAS signals which enable the selected first memory and cause the respective data-out lines to be enabled and data signals, if any, are latched thereon; the data is then presented to the data bus 209 which in turn applies it to data latch 210 for subsequent write-in operations to the memory or for any other type of operations. Once any memory array is enabled and its data is latched to the data bus, it must be disabled prior to the enablement of any other memory array. Hence a second RAS and particularly CAS signal is required, and since the second CAS signal which does the actual disabling in the latched memory is not generated internally during the current memory cycle disabling must be performed by the buffer circuits 407, 409 in combination with a power strobe to be more fully described infra with reference to FIG. 4.

Referring now to FIG. 3, four memory arrays are shown coupled to a data bus. Two memory arrays 301, 302 are of the latched type and are coupled to the data bus utilizing buffer circuit 407a (also typically of the SN74H04 type or the SN74LS04 type) in combination with a power strobe. Two memory arrays of the unlatched tri-state type 303-304 are also coupled to the data bus via data-out line 313; however, they do not require buffer circuits since the memory arrays are of the tri-state unlatched type and the output follows the input and is removed when the internally generated clock signals 303c or 304c are also removed. (Note the latched type memory does not generate the internal clock signal relying on the second CAS signal, which may never occur during the current memory cycle for unlatching). It is to be understood that although only four memory arrays are shown in FIG. 3, two of the latched and two of the unlatched type, any number of this mixture may be coupled to the data bus with the latched memory types being coupled via buffer circuits and power strobes while the unlatched types are coupled directly to the data bus.

Figure 4:
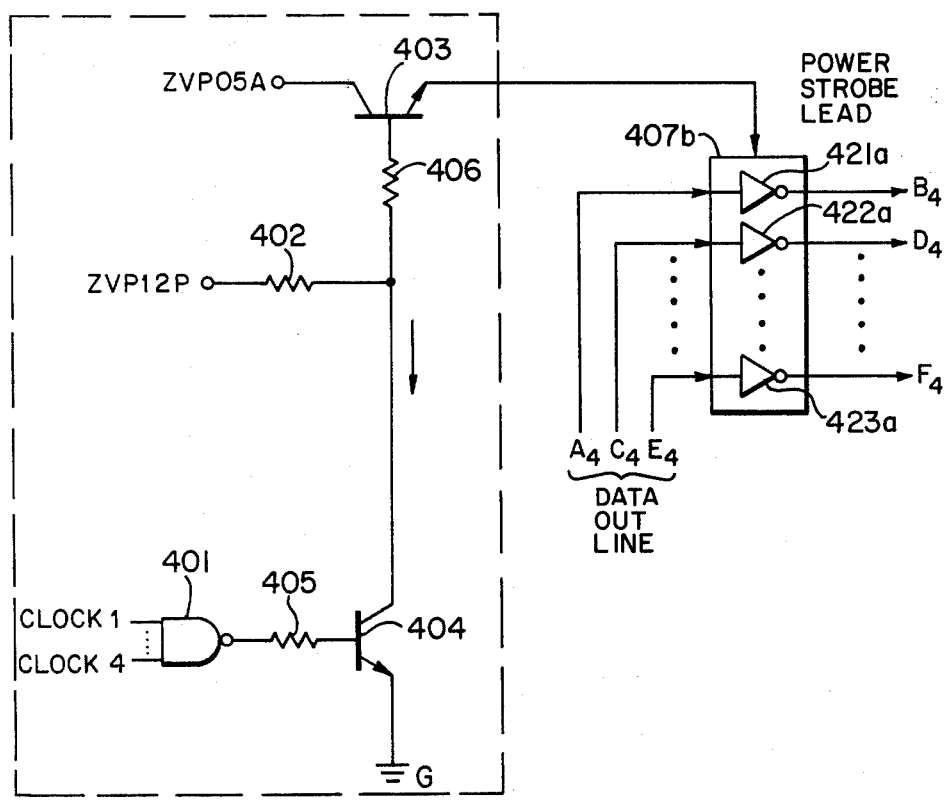
FIG. 4 is a detailed equivalent circuit diagram of the invention.
Figure 4:
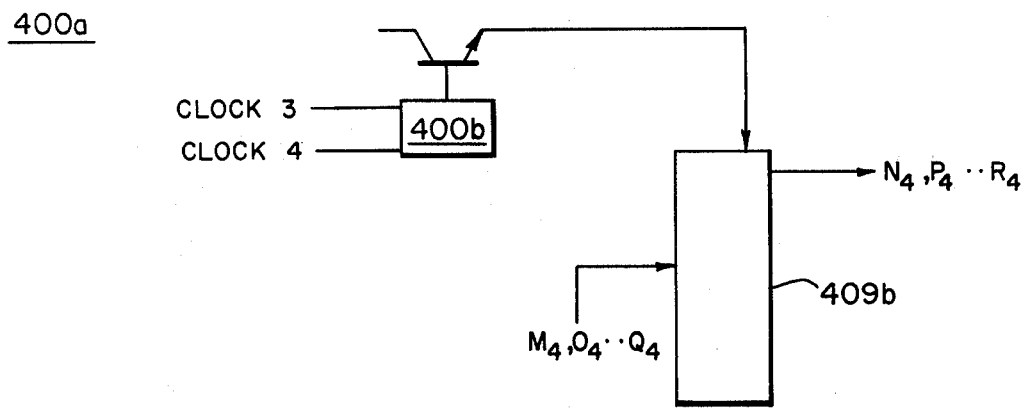

Referring to FIG. 4, details of the power strobe and buffer circuits are shown. Buffer circuits 407 and 409 are of the commercially available SN74H04 or SN74LS04 type to which prior reference has been made. Each buffer circuit 407b, 409b is comprised of six inverter type circuits 421a ... 423a. The input of each inverter circuit is coupled to a data-out line from an MOS memory chip. Thus inverter 421a is coupled to data-out line $A_4$, corresponding to data-out line A of memory chip 101 on FIG. 1. The other inverters are similarly coupled to corresponding data-out lines. The output lines $B_4$, $D_4$ ... $F_4$ of buffer circuit 407, couple the data-out lines to the data bus via the respective buffer circuit. Buffer circuits 409b are similarly arranged with respect to their memory arrays as previously discussed. A characteristic of each buffer circuit 407b, 409b is that when power is not applied to the power strobe lead it presents a high impedance or open circuit between the data-out line of the memory chips of the array and the data bus. When power is on, however, the buffer operates as a normal inverter circuit providing a high state or low state at the output terminals $B_4$ ... $F_4$, $N_4$ ... $R_4$, etc., when a low state or high state signal respectively is at the data-out line $A_4$ ... $E_4$, $M_4$ ... $Q_4$, etc. Thus, when simulating a tri-state circuit, buffer circuits 407b-409b require no power since power is turned off for this condition.

Power is strobed to the power strobe lead as follows: when a clock signal 1 or 2 is applied to NOR gate 401 it goes low and the bias on the base of NPN transistor 404 applied through resistor 405 goes low i.e. toward ground causing transistor 404 to cut off. Since positive bias is applied to the base of transistor 403 from 12 volt positive terminal ZVP12P through resistors 402, the base emitter base junction of transistor 403 is forward biased and accordingly applies ZVP05A to the power strobe lead. This action applies the necessary voltage to the buffer circuits 407b, allowing the respective data-out lines ($A_4$, $C_4$, $E_4$, etc.) to be connected to the data bus ($B_4$, $D_4$ ... $F_4$). When clock signals 1 or 2 are not applied, bias on the base of 404 goes positive causing transistor 404 to conduct to ground. Bias on the base of transistor 403 goes negative through resistor 406 causing 403 to cut off and removing power from the power strobe lead. As a readout, data-out lines ($A_4$, $C_4$, $E_4$) are disconnected from the data bus ($B_4$, $D_4$, $F_4$) simulating the high impedance state.

Figure 5A:
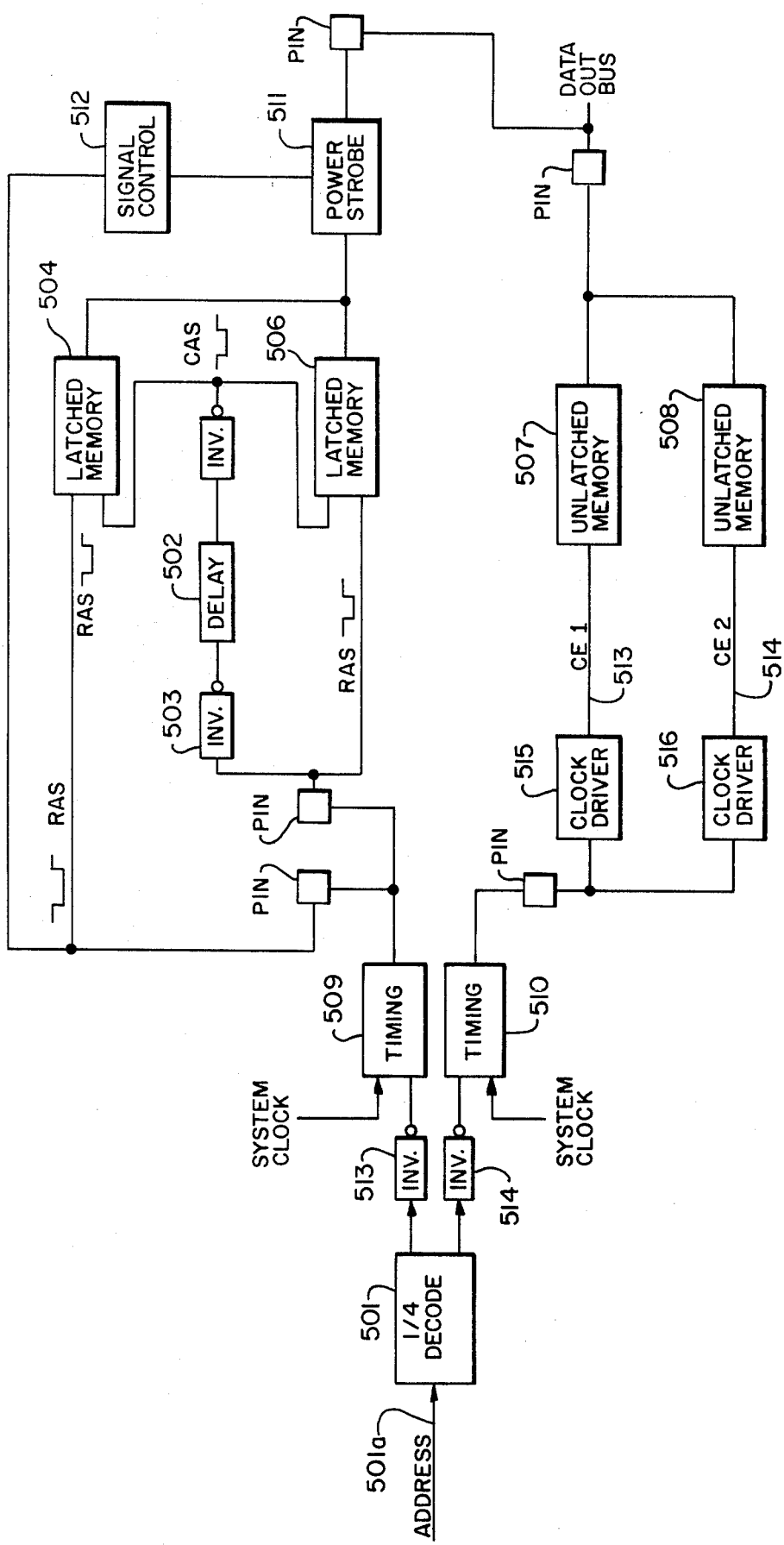
FIG. 5a is a logic block diagram of the invention.
Figure 5B:
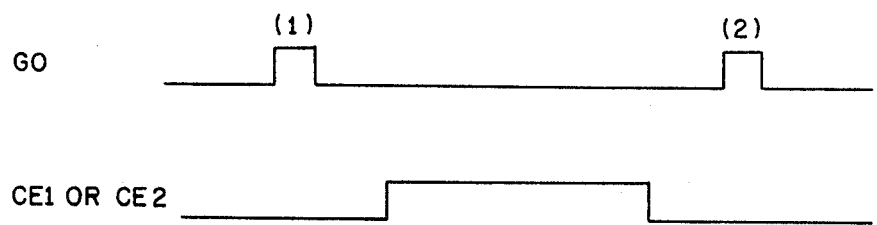
FIGS. 5b and 5c are timing diagrams of signals generated in response to a GO signal applied to memory.
Figure 5C:
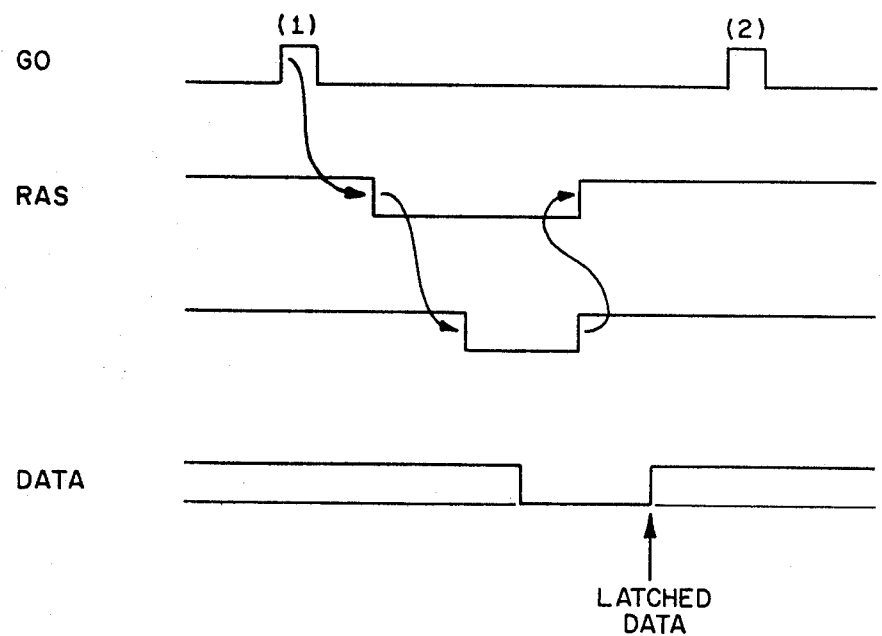

Referring now to FIGS. 5a, 5b and 5c there is shown on FIG. 5a a more detailed logic block diagram of the invention whereby latched memories 504 and 506 correspond to latched memories 301 and 302 of FIG. 3, whereas unlatched memories 507 and 508 correspond to unlatched memories 303, 304 of FIG. 3. Power strobe 511 with its control 512 correspond to power strobe 407a of FIG. 3. The squares labeled PIN are representations of pin connectors for applying input or output signals respectively thereon. A coded address signal 501a is applied to a 1 or 4 type decoder. Such a decoder may typically be of the Texas Instrument type TI74S138 (which is a 1/8 decoder since more than four rows may be utilized) which are commercially available from the previously referenced Texas Instrument Corporation. The address is decoded in the decoder 501 and applied to inverter circuits 513, 514. The output signals from inverters 513, 514 are applied to timing circuits 509, 510 together with the system clock pulses. The timing circuit 509 in response to the system block generates a RAS pulse (i.e. Row Address Strobe) which in turn generates a CAS (i.e. Column Address Strobe) from RAS by delay circuit 502. See discussion infra with respect to FIGS. 8 and 9. The timing circuit 510 is shown separate from unlatched memories 507 and 508; however, it is to be understood that it comprises part of the control circuitry of unlatched memories 507 and 508. Referring to 5b there is shown the generation of an internal clock signal for the unlatched type memory in response to a GO signal. Note that the internal clock signal is initiated and terminated between two adajacent GO signals which indicate one complete memory cycle. In response to the chip enable (CE) signal, data is applied to the data-out bus when the CE signal goes high and is removed from the data-out bus when the CE signal goes low. Note however in FIG. 5c that in response to a system clock signal applied to a latched type memory the timing circuitry for that type memory does not generate an internal clock signal similar to that of the unlatched memory. However, in response to the system clock signal, a Row Address Signal (RAS) and a Column Address Signal (CAS) is generated. By referring to FIG. 5a it will be seen that in response to the RAS signal which is delayed in delay line 502 a CAS signal is generated. Both these signals are applied to the selected latched memory either 504 or 506 which enables data to be latched to the data out bus. This data remains on the data out bus until a second CAS signal or a subsequent memory cycle (not shown) is provided to disable the data out bus from the latched memory. If no second CAS signal or subsequent memory cycle for that memory occurs, the data remains latched. Since the CAS signal is generated in response to an RAS signal and since this second system clock signal may be directed to another latched memory or even an unlatched memory, the data would remain latched to the bus even into the second memory cycle indicated by the second GO signal on FIG. 5c and would interfere with the reading or writing out of data from another memory in that second memory cycle. For this reason, the power strobe 511 and a signal control 512 (previously described) acts to disable the data out bus from the latched memory within the first memory cycle as further shown on FIG. 5c.

Figure 6:
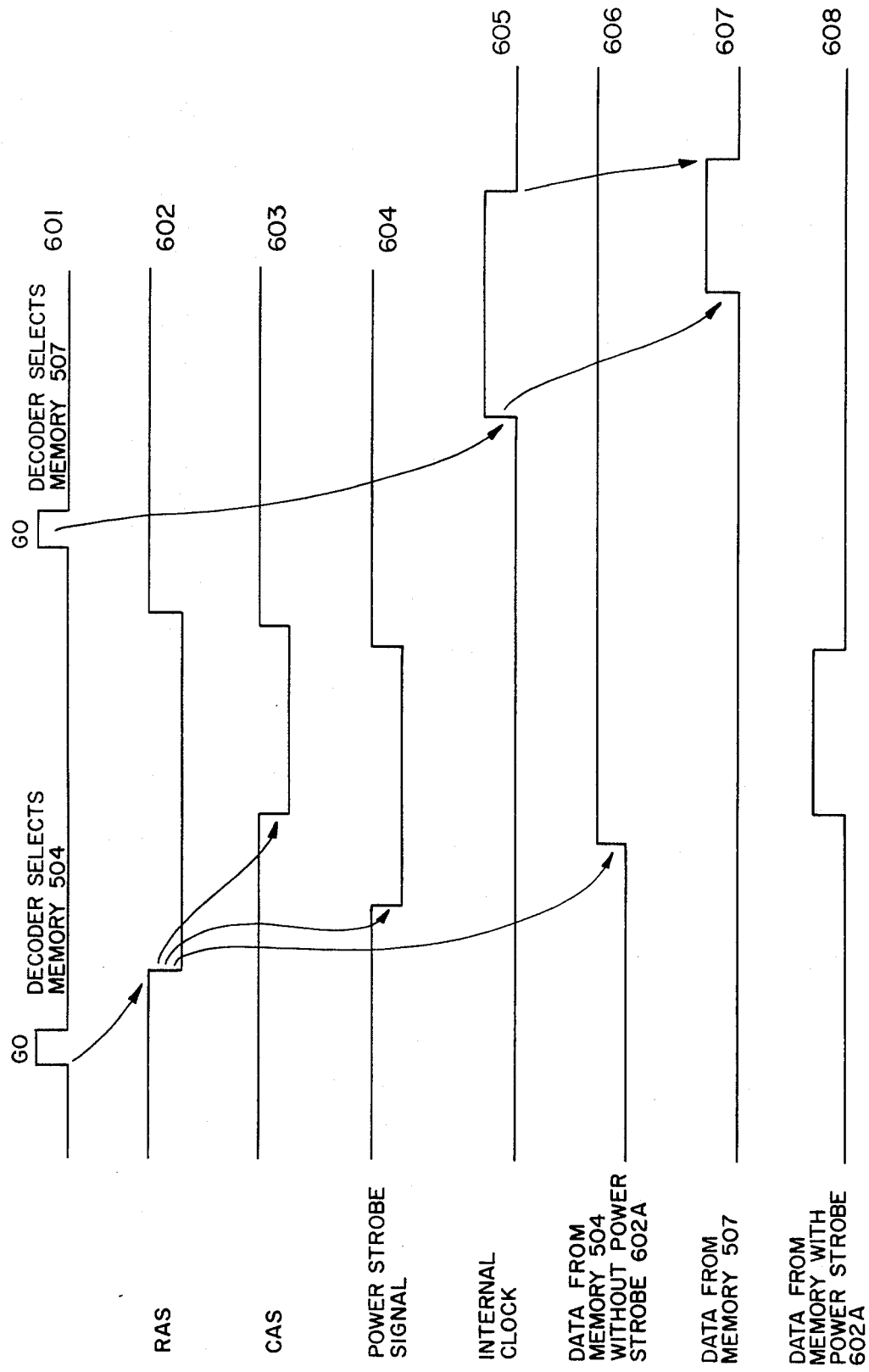
FIG. 6 is the timing diagram for the apparatus of FIG. 5.

FIG. 6 is a more detailed timing diagram of FIG. 5a showing the detailed generation of the various signals. Referring to FIG. 6 there is shown a series of GO pulses 601 which as previously noted enable one complete memory cycle. Assume that on the first GO pulse the address applied to the decoder 501 on FIG. 5a indicates that latched memory unit 504 is to be accessed. Accordingly, in response to the system clock signal 601 an RAS and CAS signal 602 are generated for enabling the latching of data out of latched memory 504 onto the data out bus. The data from memory 504 goes true and remains true as shown on timing diagram 606 of FIG. 6. The only provision that the manufacturer of the latched type memory has made for disabling or unlatching the data from the data bus is in response to a second CAS signal generated in response to a second system clock signal. As shown on FIG. 6 on the second GO signal the coded address signals applied to the decoder 501 indicating that unlatched memory 507 is to be selected and accordingly no second RAS and CAS signal is generated for the previously selected latched memory 504 and the data would remain high on the data bus as shown on timing diagram 606. However, on this second memory cycle initiated by the GO signal, an internal clock signal 605 is generated by the timing circuits 510 (FIG. 5a). In response to the internal clock signal 605 the data addressed to unlatched memory 507 will go high and remain high until just prior to the termination of the second memory cycle as shown on diagram 607 of FIG. 6. Hence it can readily be seen that the data 606 previously latched to the data bus out from previously addressed latched memory 507 interferes with the data 607 which is applied to the data bus from the later addressed unlatched memory 507. However, by utilizing the invention, the data 606 is disabled as shown on diagram 608 by the application of the power strobe signal 604 to the commercially available buffer tri-state circuit 407, 407a, or 407b. Thus, the high impedance state of the buffer circuit 407, 407a or 407b is presented between the latched memory and the data-out bus. Hence it can be seen that with this invention an interface has been provided for disabling the data of any selected latched memory from the data bus within the confines of any given memory cycle. Hence this invention provides the manufacturer of computer or computer memories a wider choice of vendors of basic memory elements from which to select the basic memory elements which the manufacturers use to fabricate his memory systems.

Figure 7:
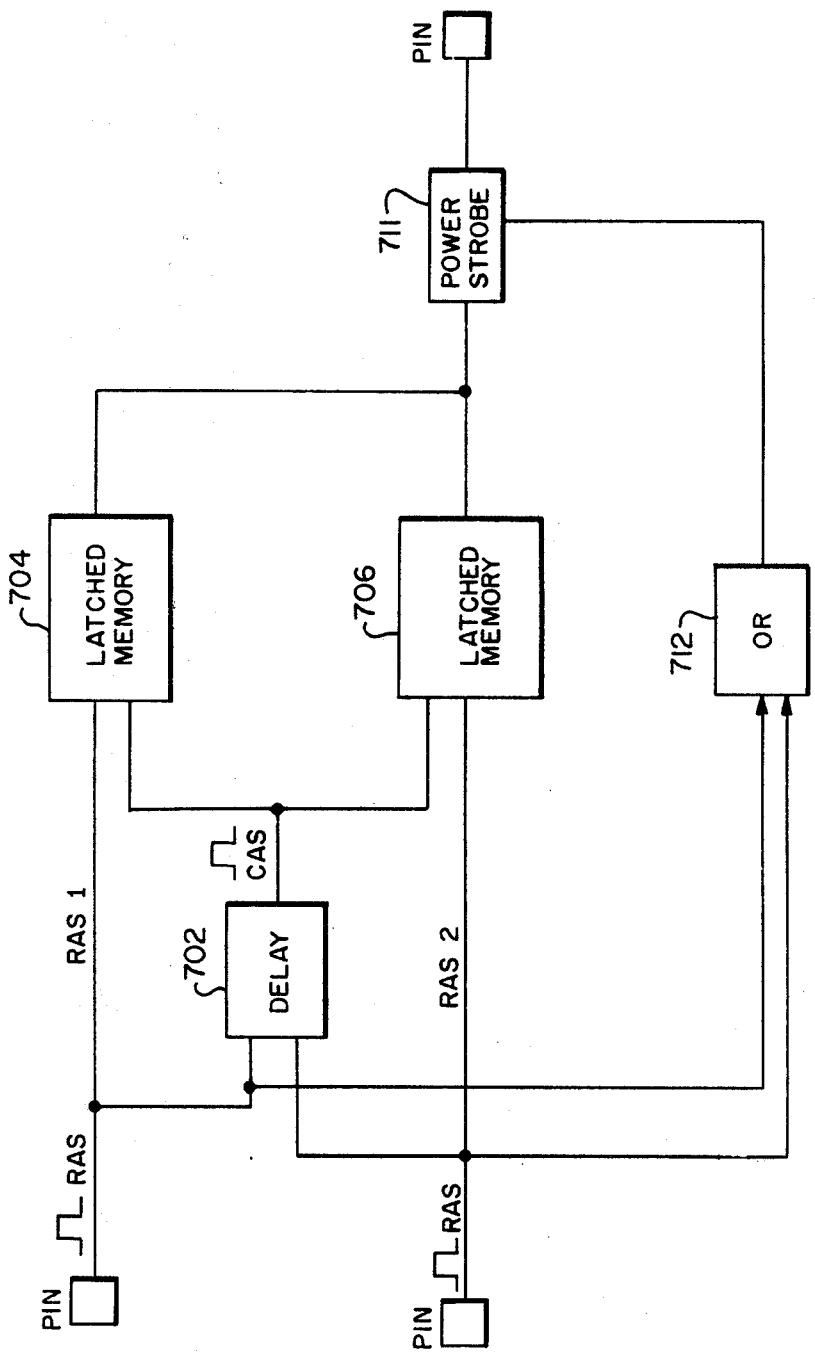
FIG. 7 is a block diagram of the invention.

Referring to FIG. 7 there is shown in block diagram the embodiment of this invention. The device of FIG. 7 is similar to the device of FIG. 5a however only the top portion of FIG. 5a is shown i.e. the latched memory portion. The latched memories of 704 and 706 of FIG. 7 correspond to the latched memories 504, 506 on FIG. 5a. The power strobe 511 of FIG. 5a is similar to the power strobe 711 of FIG. 7. It should be noted on FIG. 5a that the decoded RAS signal for any selected latched memory 504 or 506 is fed to the delay line 502, in order to generate a CAS signal for the selected memory which corresponds to feeding the RAS signal to delay line 702 which in turn generates the CAS signal which is distributed to the selected latched memory 704 or 706 of FIG. 7.

Figure 8:
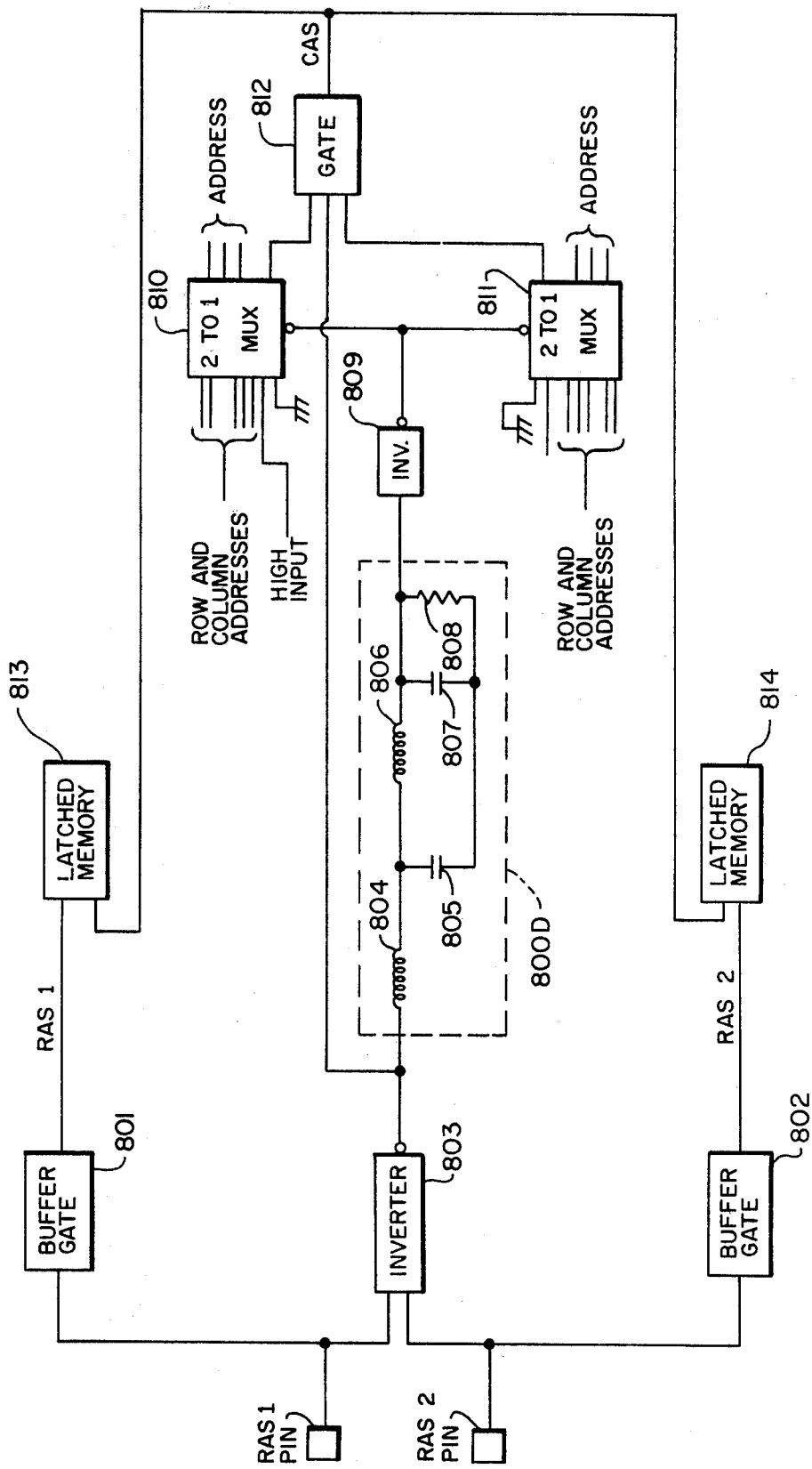
FIG. 8 is a logic diagram for generation of internal timing signals of the invention.

Referring now to FIG. 8 there is shown a detailed logic block diagram for the unique generation of the RAS and CAS timing signals when utilizing the latched type of memory. FIG. 8 shows in greater detail the latched memory portion of FIG. 7. In FIG. 8 latched memories 813, 814 corresponds to latched memories 704 and 706 respectively. The two pins RAS1 and RAS2 are similar to the two RAS input pins of FIG. 7. Moreover, the delay line 800d shown on FIG. 8 is similar to the delay line 702 of FIG. 7. However, additional circuitry shown on FIG. 8 will be described infra. Assume, therefore, that either RAS1 or RAS2 signal is applied to the input terminal pins. These signals are then applied to buffer gates 801, 802. As seen from the diagram RAS1 signal will be applied to buffer gate 801 where RAS2 signal will be applied to buffer gate 802. By the application of the RAS signal to the selected latched memory a read or write cycle is initiated for that particular latched type of memory. At the same time that the RAS signal is applied to its respective latched memory it is also applied to the inverter circuit 803. The output signal of the inverter 803 is applied to the delay line 800D and also to NAND gate 812. (It should be noted that the delay line 800D is comprised of discrete L components 804, 806 together with C components 805, 807 and R component 808. The output signals from delay line 800D is then applied to an inverter buffer circuit 809 which in turn is applied to two multiplexer circuits 810, 811. The multiplexer circuits are commercially available multiplexer circuits type TI SN74SI57 and apply the column addresses to the 4K memory devices 813 and 814. When the delayed RAS forms CAS it is applied to the 4K latched memory devices 813 and 814 to strobe the addresses to the memory. In addition to providing addresses to the latched memory the multiplexers 810, 811 together with the delay lines and the inverters provide an inherent tracking feature to ensure that the CAS signal turns on after the addresses are valid. This tracking feature is accomplished by applying three positive going input signals to gate circuit 812. Two of the input signals are output signals from multiplexers 810 and 811 and are applied to the input terminals of NAND gate 812 upon the application of RAS1 or RAS2. It should be noted that these two signals are delayed and they occur only after the worst case delay is accounted for by multiplexers 810 and 811 and the device causing the worst case delay would apply the CAS pulse. This is necessary because the CAS signal must occur after the addresses have settled down and have become valid i.e. the address signals have stabilized. This is accomplished in that gate 812 is gated by the last positive going signal which will turn on the CAS signal. The third input signal to gate 812 is applied from the inverter 803 and is used to turn off the CAS signal. The signal from inverter 803 is a positive going signal but it occurs at an earlier point in the cycle than the other two input signals to gate 812 and its function is to turn off the CAS signal. It will turn off the CAS when it goes negative which indicates the end of the particular cycle in question. The CAS signal is then distributed to the 4K latched memory devices 813 and 814. Further details as to the operation of the circuit of FIG. 8 to generate a CAS pulse are given in relation with the timing pulses of FIG. 9.

Figure 9:
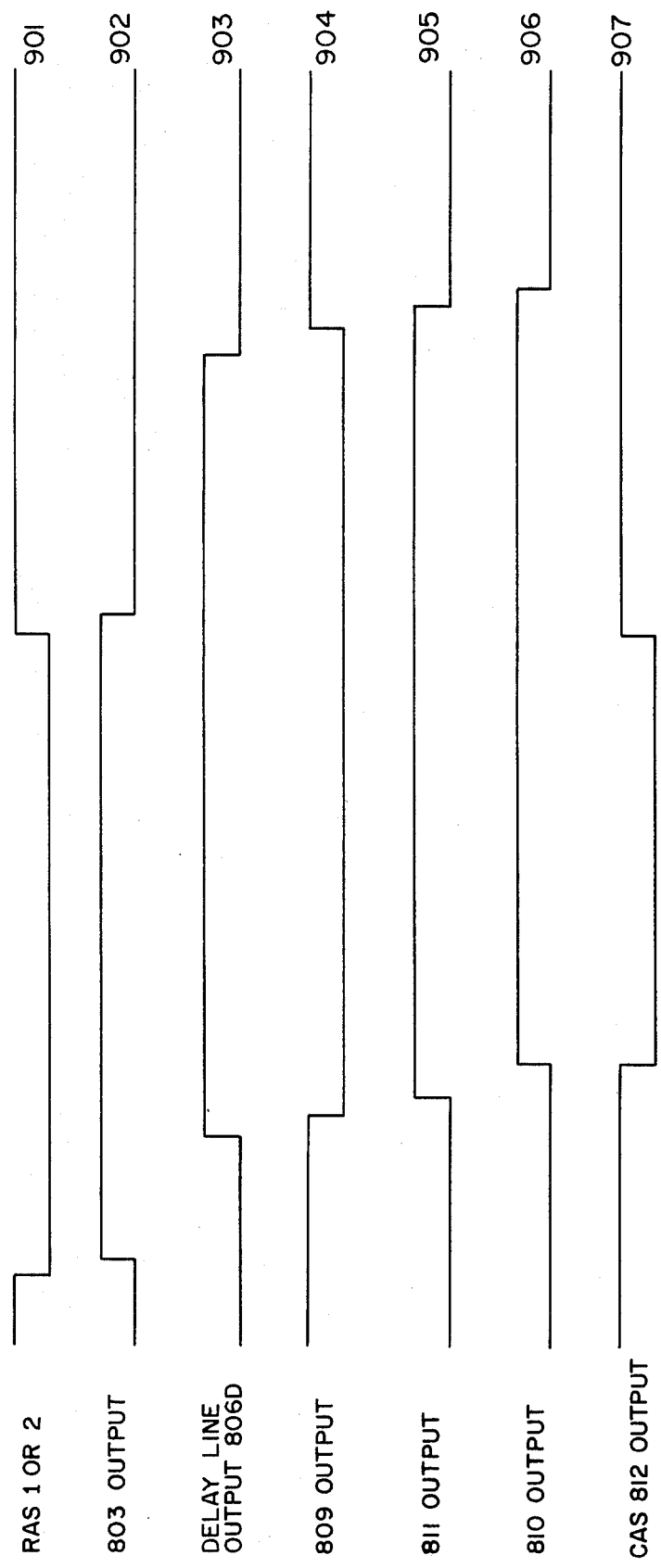
FIG. 9 is the timing diagram for the apparatus of FIG. 8.

Referring now to FIG. 9, timing diagram 901 indicates the timing relationship of either the RAS1 or RAS2 signal. RAS1 or RAS2 signals are decoded timing signals for the row address. As previously described, the address timing signals are applied to a decoder 501 shown on FIG. 5a which decodes these signals. Its function is to initiate a read or write memory cycle. Timing pulse 902 is the output pulse from inverter 803 which is applied to the input terminal of delay line 800D and one leg of gate 812. It should be noted that there is a slight delay between the input and output of inverter 803 which is due to the circuitry therein. The output timing pulse from delay 800D is shown on timing diagram 903 and this defines the relationship between the leading edge of the RAS pulse and the leading edge of the CAS pulse fed into the inverter buffer circuit 809. The inverted output from inverter buffer 809 (timing diagram 904) is then fed to the strobe input terminals of two to one multiplexers 810 and 811 respectively. The multiplexers then can select the row and column address in response to this decoded signal. Also one output from each multiplexer 810 and 811 is applied to respective input terminals of gate circuit 812. The corresponding inputs of which are tied to logic zero and a logic one signal and thus produce a positive going pulse from both 810 and 811. Since different multiplexers have different delay characteristics merely because of slight differences in manufacturing, etc. one of the output signals from the multiplexers will be delayed longer than the other.

Assume for the purposes of this discussion that the signal is delayed longer in multiplexer 810 and emerges after the signal from multiplexer 811; then the output signal from multiplexer 810 is used to initiate the leading edge of the CAS, since this last signal is the one to finally enable gate 812. The gating edge of the negative going CAS signal will then strobe the column addresses to the 4K latched memories. The trailing edge of the CAS signal is controlled by the output signal of inverter 803 which is the third input to gate circuit 812. This circuit as previously described with respect to FIG. 8 terminates the CAS output pulse as shown on diagram 907.

Having described the invention, what is claimed is new and novel and for which it is desired to secure letters patent is:

1. In combination with a random access memory array (RAM) having data in and data out lines and enabling means for reading/writing data in or data out of said RAM during one memory cycle of said RAM, said random access memory array (RAM) being comprised of first type memory elements whereby information is retained on said data-out lines for the duration of the memory cycle when an enabling signal on the enabling means is removed, and apparatus for uncoupling said data out lines of said RAM from a data bus comprising:
   a. first means, coupled to said data out lines and said data bus for disconnecting said data out lines from said data bus during the memory cycle of said RAM;
   b. second means, coupled to said first means, for providing power to said first means, said first means disconnecting said data out lines from said data bus only when power is provided by said second means to said first means;
   c. third means in said second means for controlling the power to said second means, said third means being comprised of at least two NPN transistors wherein the collector of one of said transistors is coupled to the base of the other of said transistors.

2. The combination as recited in claim 1 including gate means responsive to clock pulses for providing electric signals to said one of said transistors for causing said one of said transistors to become non-conductive.

3. The apparatus as recited in claim 2 including bias means coupled to the collector of said one transistor and to the emitter of said other transistor for providing bias to said first and second transistors.

4. The apparatus as recited in claim 3 including clock pulse means coupled to said one of said transistors for causing said one of said transistors to become non-conducting and for causing said other of said transistors to become conducting
   whereby power strobe is supplied to said third means thus causing said data-out lines to become disconnected from said bus.

5. In combination with a random access memory array (RAM) having data in and data out lines and enabling means coupled to said RAM for writing/reading data in or out of said RAM, said random access memory array being comprised of first type memory elements whereby information is retained on said data out lines when an enabling signal on said enabling means is removed, said random access memory array being further comprised of second type memory elements whereby information is not retained on said data out lines when the enabling signal on said enabling means is removed, an apparatus for coupling and uncoupling said data out lines on said RAM to or from a data bus comprising:
   a. first means, coupled to said data out lines of said first type memory elements and to said data bus for disconnecting said data out lines from said data bus after said enabling signal has been removed; and,
   b. second means, coupled to said first means for providing power to said first means and disconnecting said data out lines of said first type memory elements only when power is provided to said first means, the disconnecting of said data out lines of said first type memory elements from said data bus being effected by said first means providing a high impedance between said data out lines and said data bus.

6. The apparatus as recited in claim 5 including third means coupled to said second means for controlling the power to said second means.

7. The apparatus as recited in claim 6 wherein said third means is comprised of at least two transistors wherein the collector of a first of said transistors is coupled to the base of a second of said transistors.

8. The apparatus as recited in claim 7 including gate means responsive to clock pulses for providing electric signals to said first of said transistors for causing said first of said transistors to become non-conducting.

9. The apparatus as recited in claim 9 including bias means coupled to the collector of said first transistor and to the emitter of said second transistor for providing bias to said first and second transistors
   whereby power is supplied to said first means when a clock pulse is applied to said gate means.

* * * * *

UNITED STATES PATENT OFFICE
CERTIFICATE OF CORRECTION

Patent No. 4,044,330    Dated August 23, 1977

Inventor(s) Robert B. Johnson and Chester M. Nibby, Jr.

It is certified that error appears in the above-identified patent and that said Letters Patent are hereby corrected as shown below:

Column 10, line 23, delete "strobe".

Column 10, line 62, delete "9" second occurrence, and substitute therefor -- 8 --.

*Signed and Sealed this*

*Twenty-seventh* Day of *December 1977*

[SEAL]

Attest:

RUTH C. MASON
*Attesting Officer*

LUTRELLE F. PARKER
*Acting Commissioner of Patents and Trademark*